(12) United States Patent
Lin

(10) Patent No.: US 6,713,193 B2
(45) Date of Patent: Mar. 30, 2004

(54) ORGANIC EL DEVICE

(75) Inventor: Tung-Shen Lin, Tainan (TW)

(73) Assignee: Lightronik Technology Inc., Tainan (TW)

( * ) Notice: Subject to any disclaimer, the term of this patent is extended or adjusted under 35 U.S.C. 154(b) by 0 days.

(21) Appl. No.: 10/143,772

(22) Filed: May 14, 2002

(65) Prior Publication Data

US 2004/0001967 A1 Jan. 1, 2004

(51) Int. Cl.$^7$ .............................................. H05B 33/12
(52) U.S. Cl. ........................ 428/690; 428/917; 313/504; 313/506
(58) Field of Search ................................ 428/690, 917; 313/504, 506; 252/301.16

(56) References Cited

U.S. PATENT DOCUMENTS

| | | | |
|---|---|---|---|
| 3,935,031 A | 1/1976 | Adler | 136/206 |
| 4,127,412 A | 11/1978 | Rule et al. | 96/1 PC |
| 4,356,429 A | 10/1982 | Tang | 313/503 |
| 4,769,292 A | 9/1988 | Tang et al. | 428/690 |
| 5,281,489 A | * 1/1994 | Mori et al. | 428/690 |
| 6,074,734 A | 6/2000 | Kawamura et al. | 428/220 |
| 6,093,864 A | 7/2000 | Tokailin et al. | 585/25 |

FOREIGN PATENT DOCUMENTS

JP 5-339565 A * 12/1993

OTHER PUBLICATIONS

C.W. Tang et al. "Organic Electroluminescent Diodes", Appl. Phys Letter 51, Sep. 1987, pp. 913–915.

C.W. Tang et al. "Electroluminescence of Doped Organic Thin Films", J. Appl. Phys. 65, May 1989, pp. 3610–3616.

* cited by examiner

Primary Examiner—Marie Yamnitzky
(74) Attorney, Agent, or Firm—Intellectual Property Solutions, Incorporated

(57) ABSTRACT

An organic EL device which contains an anode, a cathode, and at least one organic thin-film layer including a light emitting layer which contains a compound represented by the following general formula (1):

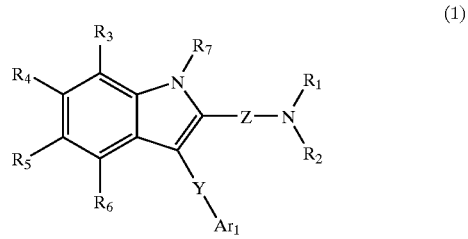

(1)

wherein $Ar_1$ represents a substituted or unsubstituted aromatic group; Y represents a single bond or —CH=CH—; Z represents a substituted or unsubstituted aromatic group; $R_1$, $R_2$ and $R_7$ each independently represents a substituted or unsubstituted alkyl group, a substituted or unsubstituted aromatic group; $R_3$ to $R_6$ each independently represents a hydrogen atom, a halogen atom, a cyano group, a substituted or unsubstituted alkyl group, a substituted or unsubstituted amino group, a substituted or unsubstituted alkoxy group, a substituted or unsubstituted aromatic group.

3 Claims, 2 Drawing Sheets

ORGANIC EL DEVICE

BACKGROUND OF THE INVENTION FIELD OF THE INVENTION

This invention generally relates to a light emitting device, and more specifically to an organic electroluminescent device of a blue luminescent material having an indole skeleton and good light-emitting properties.

DESCRIPTION OF THE RELATED ART

The organic electroluminescent device (organic EL device) is a light emitting device, containing a fluorescent material which emits light in response to the recombination of hole and electron injected from anode and cathode (C. W. Tang et al. Applied Physics Letters, 51,913 (1987)). Luminescence efficiency can be improved through a method of doping a fluorescent dye. An organic EL device with a coumarin dye as the doping material (Applied Physics Letters, 65,3610 (1989)) can be used to greatly improve the luminescence efficiency. A C-545T (U.S. Pat. No. 4,769, 292), which is a well-known coumarin dye, has the following structure:

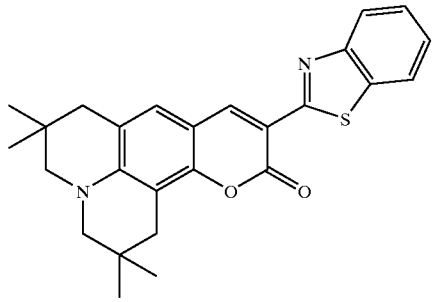

For improving the recombination efficiency of the injected hole and electron, multi-layered devices have been introduced. A hole transporting layer (HTL) containing hole transporting material (HTM) is used to improve the hole injection and transporting from the anode into the organic layer. An NPB (4-4'-bis[N-(1-naphthyl)-N-phenyl-amino-]bisphenyl), which is a well-known HTM, has the structure:

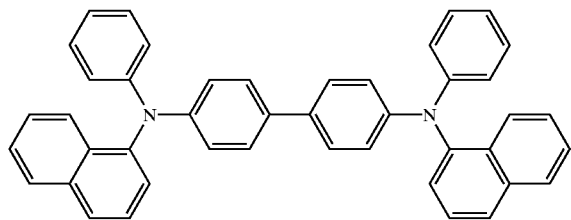

An electron transporting layer (ETL) consisting of an electron transporting material (ETM) is used to improve the electron injection from the cathode into the organic layer. An $Alq_3$ (aluminum tris (8-hydroxyquinolate)), which is a typical ETM, has the structure:

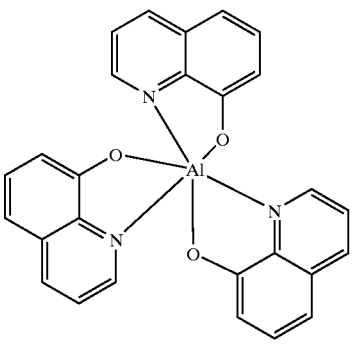

Other materials such as oxadiazole compounds, triazine compounds, and triazole compounds also can be used as ETM.

Aromatic dimethylidyne compounds have been used as the blue light emissive material for the organic EL device (U.S. Pat. No. 6,093,864). One example is DPVBi (1,4-bis2, 2-di-phenylvinyl)biphenyl with an EL peak at about 485 nm, having the following structure:

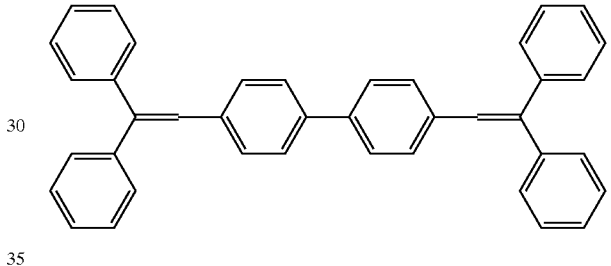

SUMMARY OF THE INVENTION

An object of the present invention is to provide a material having an indole skeleton and to provide an organic EL device having blue luminescence. The organic EL device comprises an anode, cathode, and one or more organic thin film layers which contain, either singly or as a mixture, an indole compound represented by the following general formula (1):

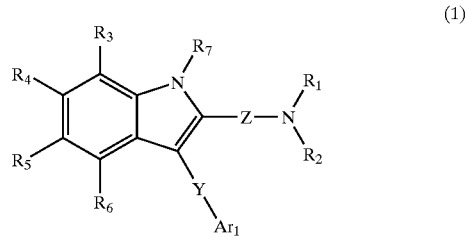

(1)

wherein $Ar_1$ represents a substituted or unsubstituted aromatic hydrocarbon group, or a substituted or unsubstituted aromatic heterocyclic group; Y represents a single bond or —CH=CH— group; Z represents a substituted or unsubstituted aromatic hydrocarbon group, or a substituted or unsubstituted aromatic heterocyclic group; R1 and R2 represent a substituted or unsubstituted alkyl group, a substituted or unsubstituted aromatic hydrocarbon group, or a substituted or unsubstituted aromatic heterocyclic group; any two of Z, R1 and R2 may form an aromatic heterocyclic or hydrocarbon ring; R3 to R6 each independently represent a hydrogen atom, a halogen, a cyano group, a substituted or unsubstituted alkyl group, a substituted or unsubstituted amino group, a substituted or unsubstituted alkoxy group, a substituted or unsubstituted aromatic hydrocarbon group, or a substituted or unsubstituted aromatic heterocyclic group; and R7 represents a substituted or unsubstituted alkyl group, a substituted or unsubstituted aromatic hydrocarbon group, or a substituted or unsubstituted aromatic heterocyclic group.

DETAILED DESCRIPTION OF THE INVENTION

Figure 1:
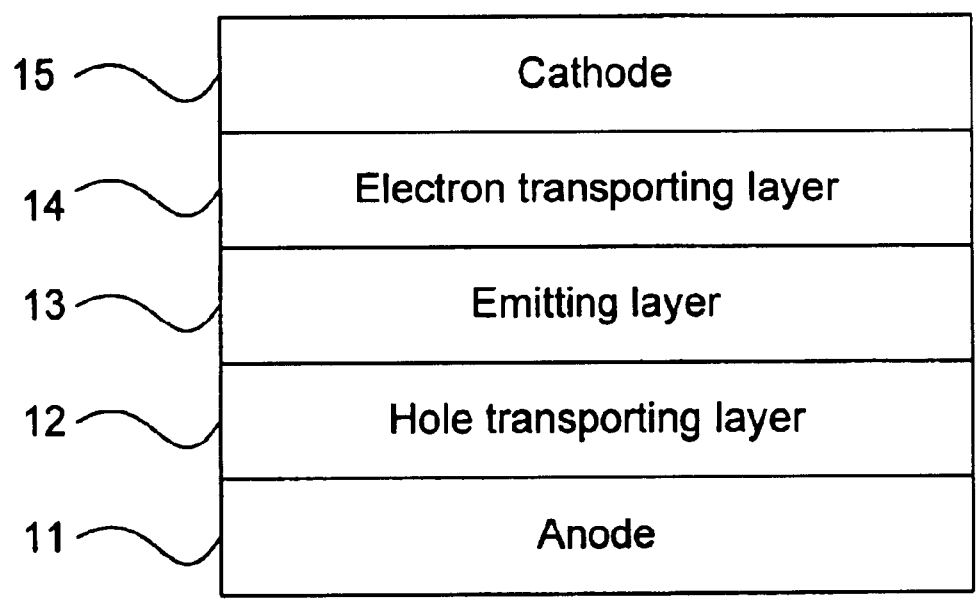
FIG. 1 illustrates a construction of an organic EL element of the present invention.

The present invention will hereinafter be described in detail.

In the present invention, an organic EL element contains light emitting material having an indole skeleton, represented by the following general formula (1):

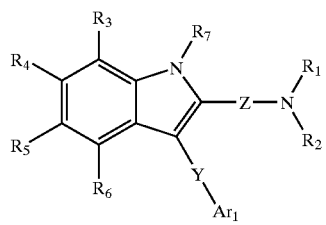

(1)

wherein Ar1, Y, Z, R1 to R7 have the same meaning as above.

These indole based compounds have fluorescent properties in a solid state. In order to enhance the fluorescent properties, a group having a nitrogen atom acting as a donor group can be substituted at the 2-position of the indole to improve the polarity of these compounds. For improving the hole-transporting or electron-transporting properties, R1, R2 or R4 can be substituted with hole-transporting group or electron-transporting group. Examples of the structure are shown hereinbelow:

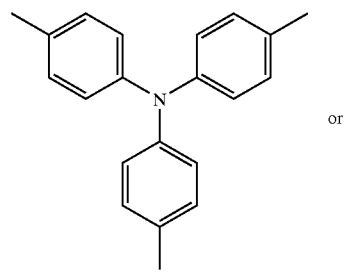

or

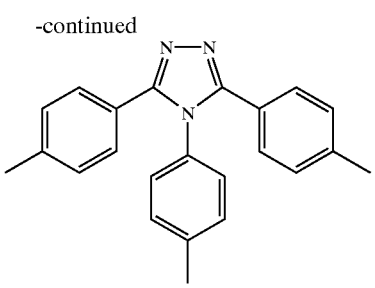

Z represents a substituted or unsubstituted aromatic hydrocarbon group or a substituted or unsubstituted aromatic heterocyclic group; and R1 and R2 represent a substituted or unsubstituted alkyl group, a substituted or unsubstituted aromatic hydrocarbon group, or a substituted or unsubstituted aromatic heterocyclic group. Examples of the indole based compounds are shown below.

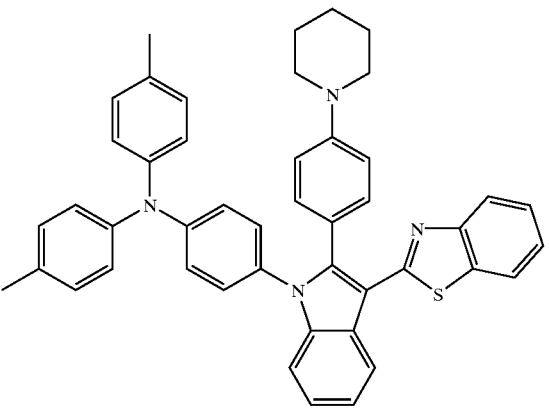

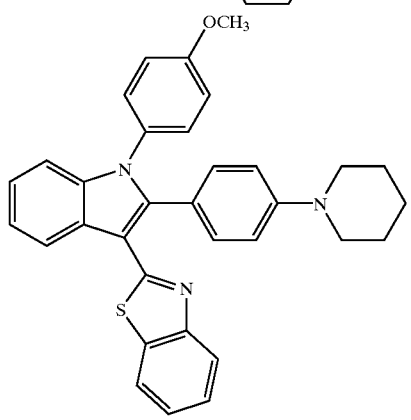

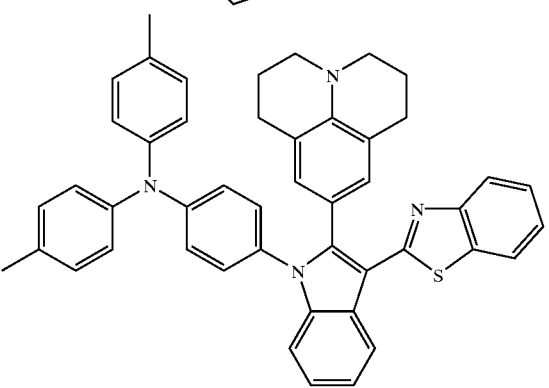

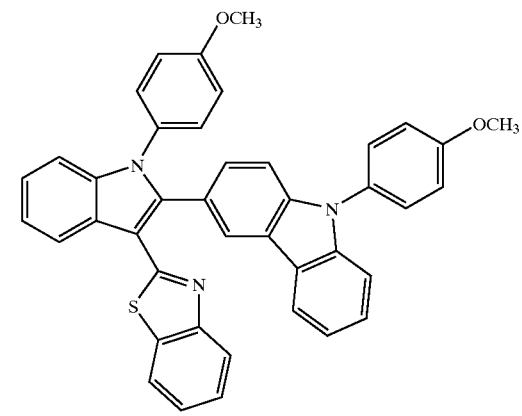
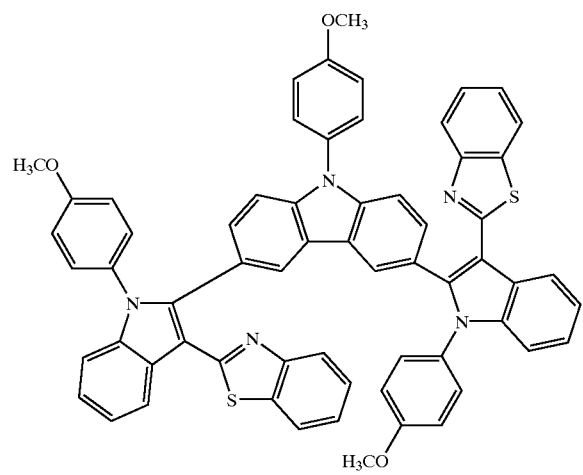
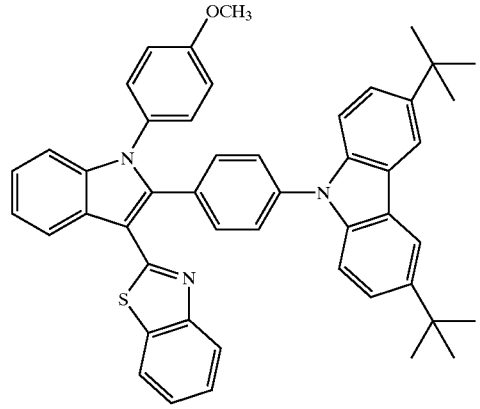
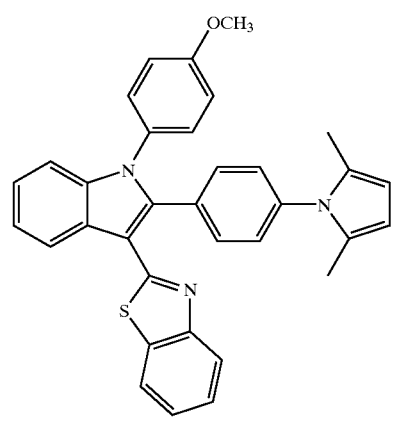
-continued
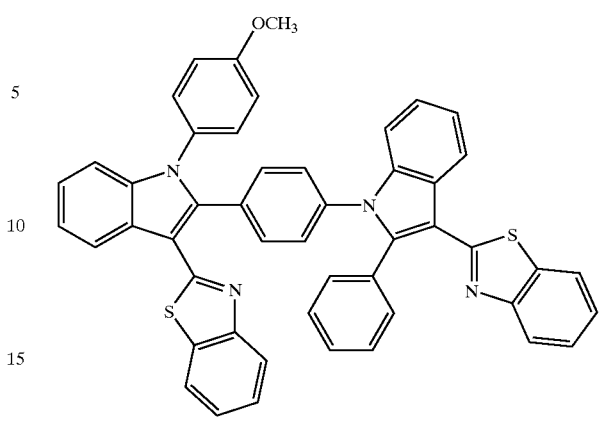
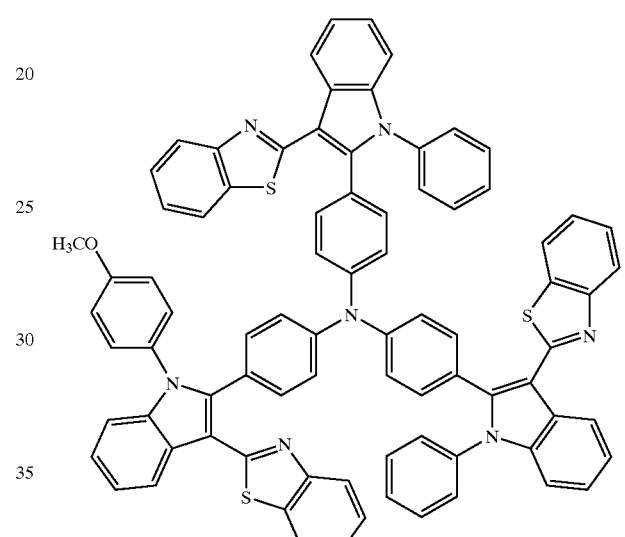
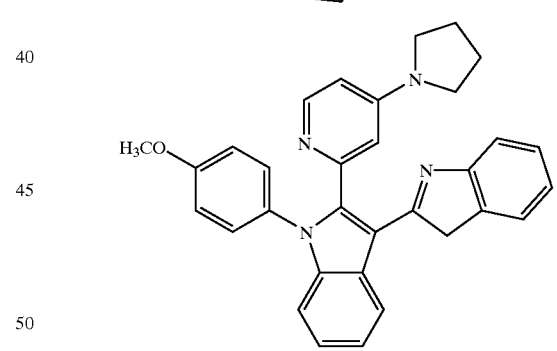
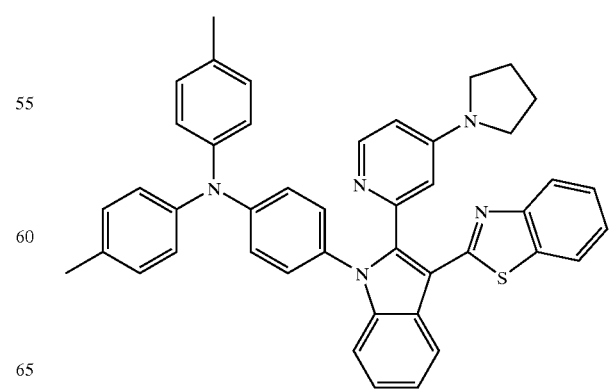

-continued
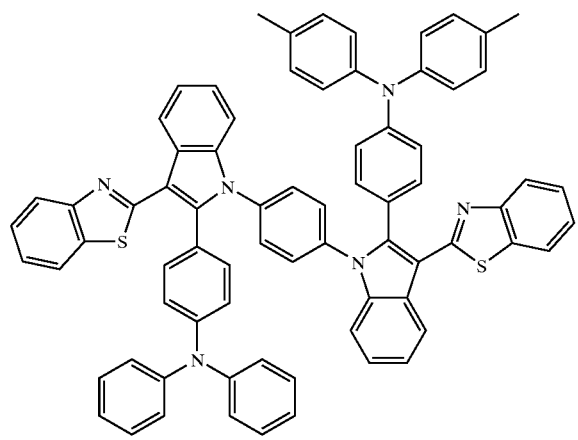
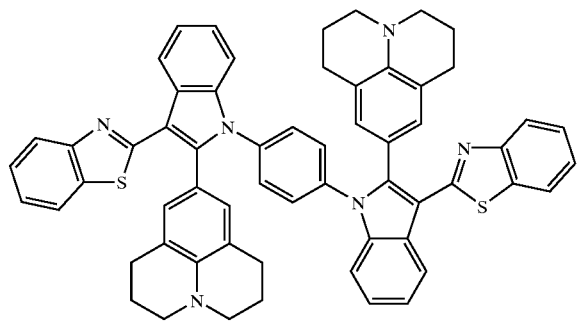
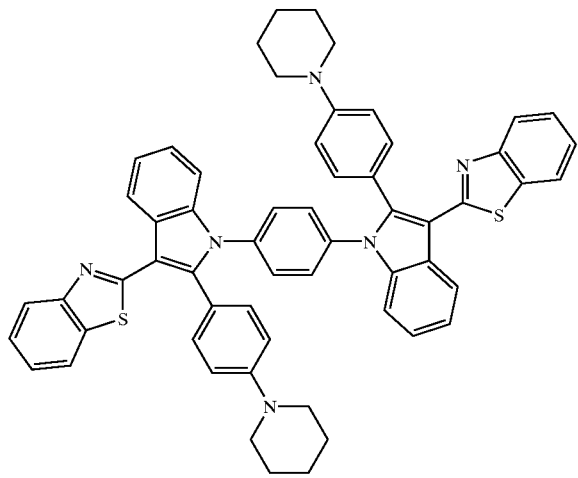
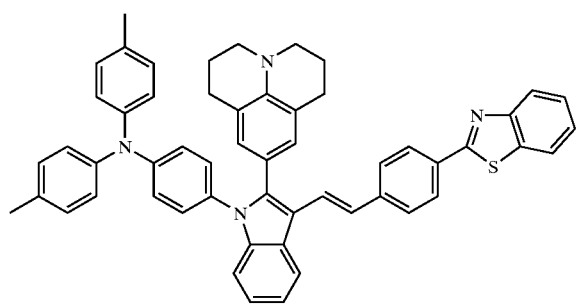
-continued
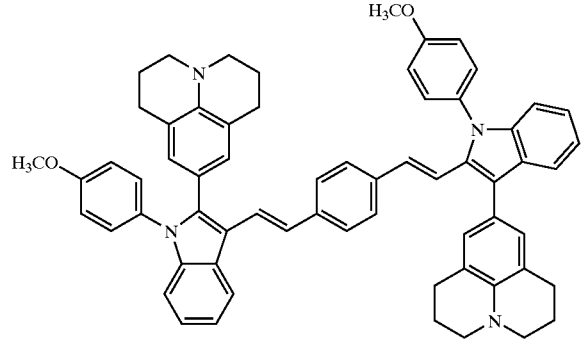
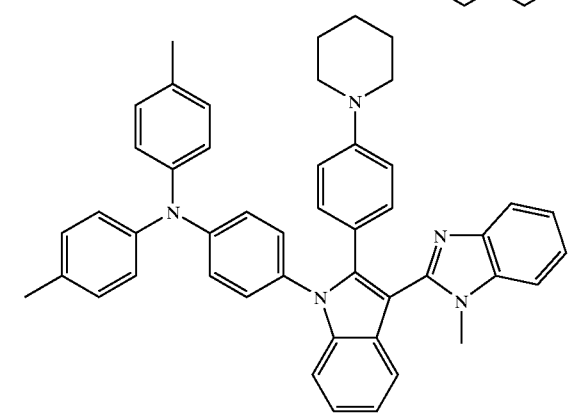
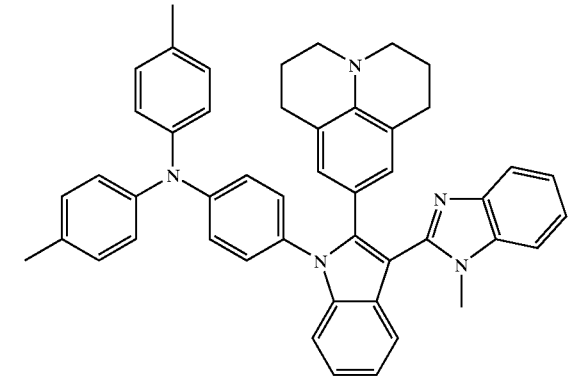
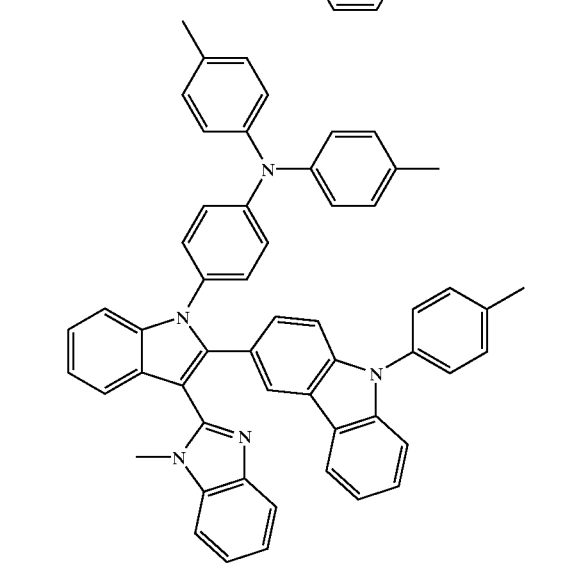

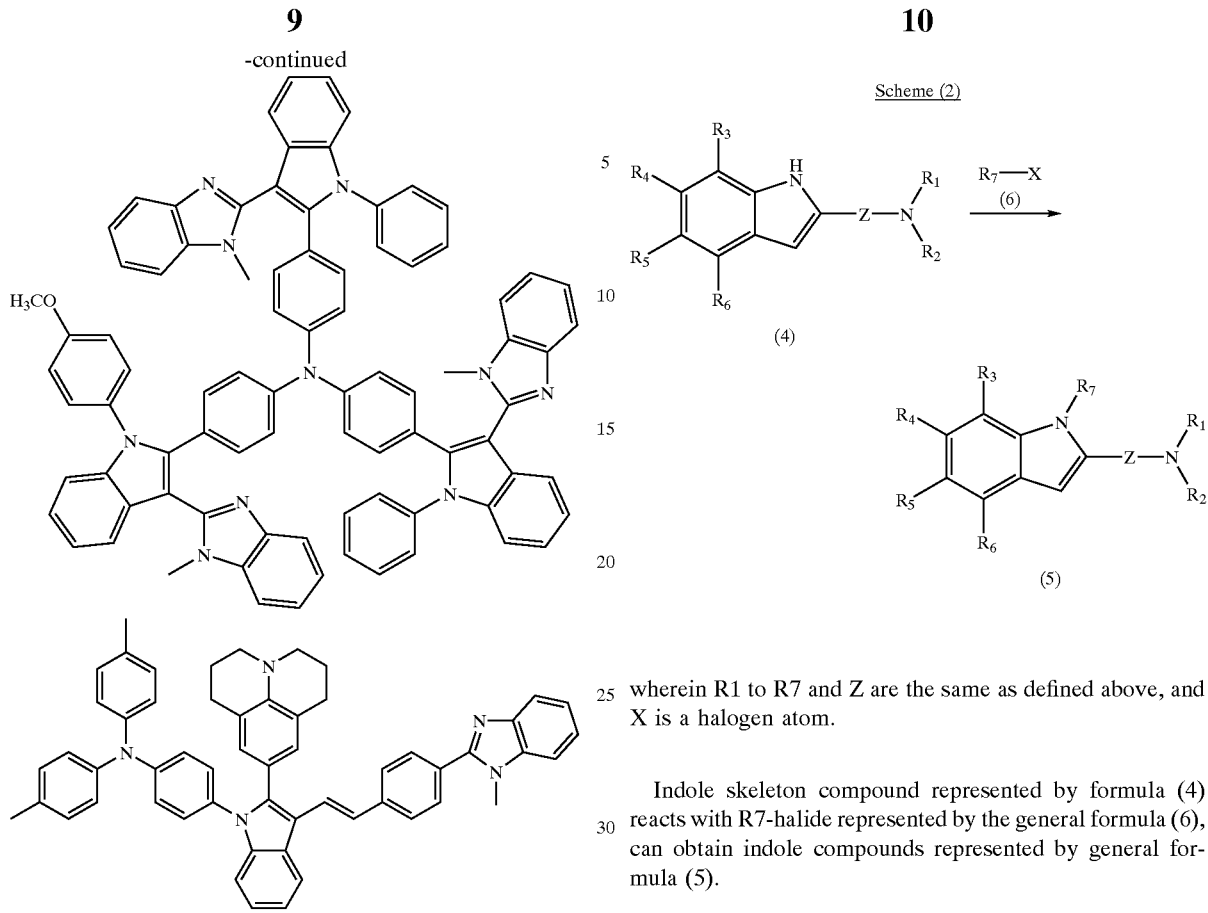

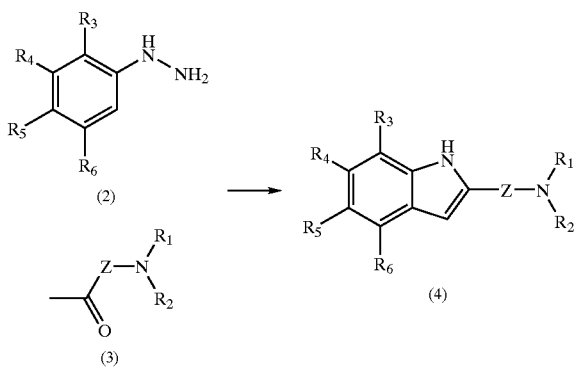

Referring to the following reaction schemes, synthesis methods to obtain the indole compound represented by the formula (1) of the present invention will be described.

The main skeleton of the indole compounds can be formed by the following scheme (1):

wherein R1 to R6 and Z are the same as defined above.

Hydrazine compound (represented by the general formula 2) reacts with aryl-phenone compound (represented by the general formula 3) to obtain the indole skeleton compound represented by general formula (4).

Methods to form R7 group are shown by the following scheme (2) or (3).

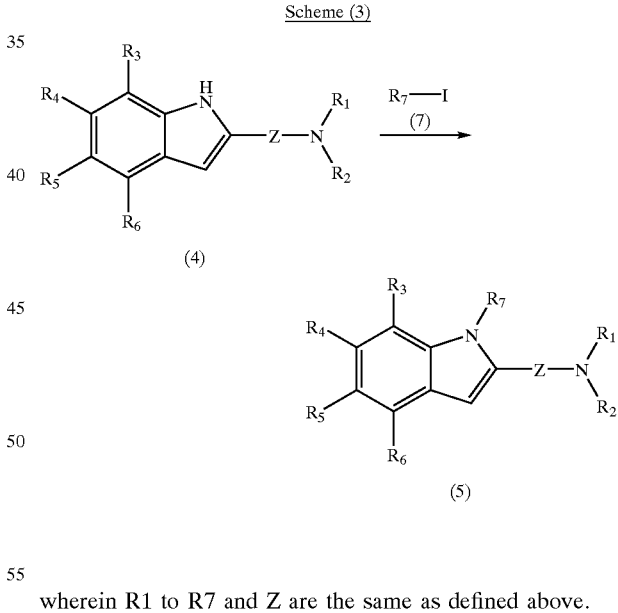

wherein R1 to R7 and Z are the same as defined above, and X is a halogen atom.

Indole skeleton compound represented by formula (4) reacts with R7-halide represented by the general formula (6), can obtain indole compounds represented by general formula (5).

wherein R1 to R7 and Z are the same as defined above.

Indole skeleton compounds represented by formula (4) react with aryliodide compounds represented by the general formula (7), can obtain indole compound represented by the general formula (5).

As shown in the following scheme (4), indole skeleton compound represented by the general formula (1) of the present invention can be obtain by the 2-step reactions.

Scheme (4)

Step (1):

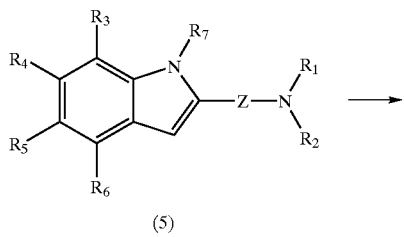

(5)

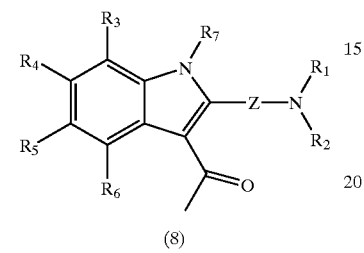

(8)

wherein R1 to R7 and Z are the same as defined above.

Formylation of indole based compound represented by the general formula (5) to get indole based aldehyde represented by the general formula (8).

Step (2):

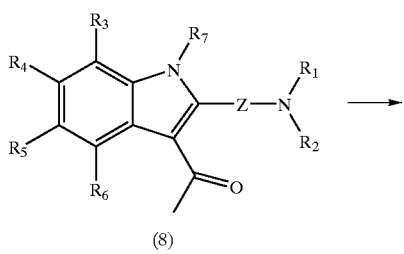

(8)

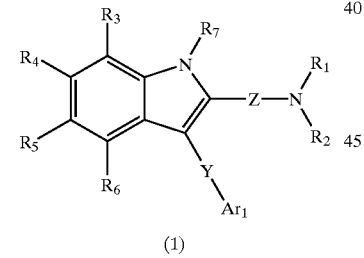

(1)

wherein R1 to R7, Ar1, Y and Z are the same as defined above.

The indole skeleton compounds represented by the general formula (1) wherein Y is a —CH=CH— group can be obtained if indole based aldehyde represented by the general formula (8) reacts with a Witting reagent having the following general formula:

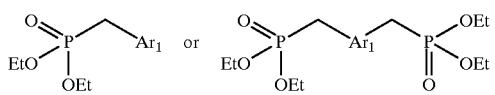

wherein Ar1 is the same as defined above.

The indole skeleton based compounds represented by the general formula (1) wherein Y is a single bond can be obtained if the indole based aldehyde represented by the general formula (8) reacts with amino aromatic compound having the following general formula:

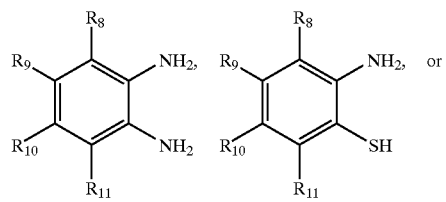

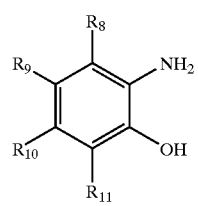

wherein R8 to R1 are the same as defined R3 to R6.

The organic EL device according to the present invention has a multi-layered structure including a light emitting layer, hole transporting layers, and electron transporting layers.

Hole transporting layer contains one or more organic layers including a hole injection layer. A hole injection layer increases the light emitting performance by improving the hole injection from the anode into the organic layers, and improving the contact of anode with organic layers. Typical compounds for the hole injection materials include porphyrin compounds (U.S. Pat. No. 3,935,031, or U.S. Pat. No. 4,356,429) having the following illustrative structure:

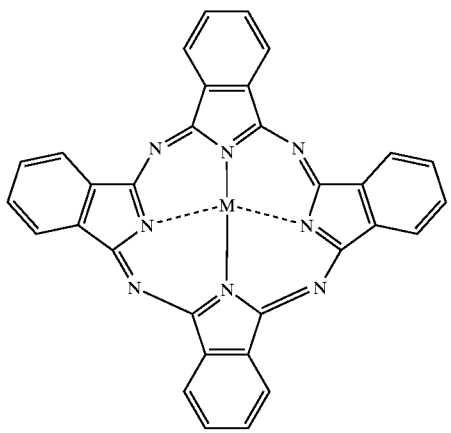

wherein M is a metal, metal oxide, or metal halide.

Aromatic tertiary amine compounds (U.S. Pat. Nos. 4,127,412, 6,074,734) include diarylamine or triarylamine having the example structures:

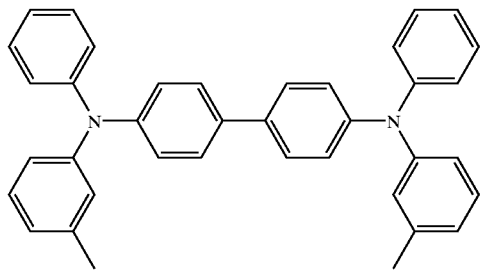
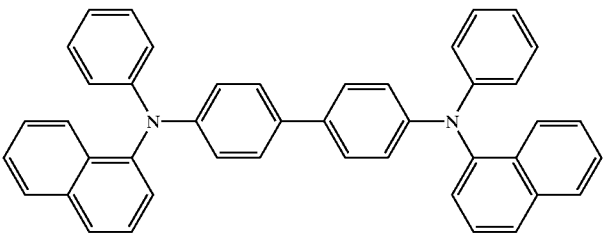
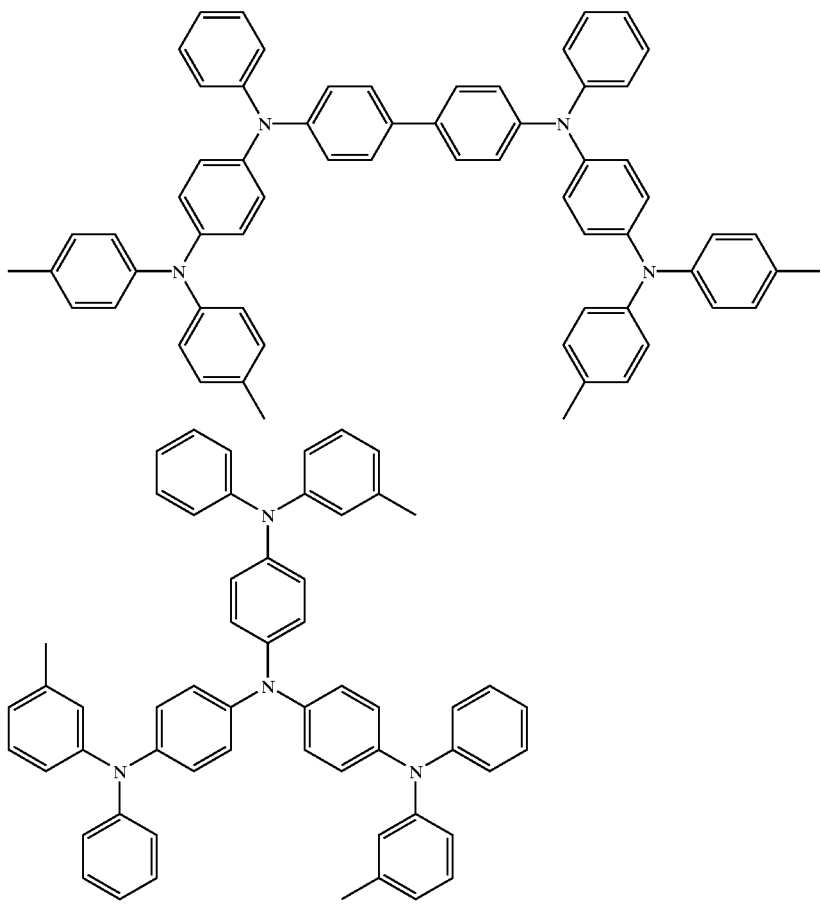

These compounds are suitable for both hole injection materials and hole transporting materials.

The electron transporting layer contains one or more organic layers to inject and transport electron from cathode into organic layer. An electron injection layer increases the light emitting property by improving the electron injection performance from the cathode into the organic layers. Typical compounds for the electron injection materials include oxadiazole compounds, triazine compounds and triazole compounds. Examples of these compounds are shown below:

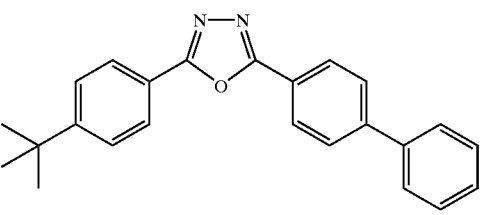

Cathode for an organic EL device can be formed by vacuum deposition of a single metal or two kinds of metal. Typical examples of using single metal as cathode include aluminum (Al), magnesium (Mg), calcium (Ca) and lithium (Li). Common examples of using two kinds of metal as cathode include aluminum-lithium (Al—Li) and magnesium-silver (Mg—Ag). In this present invention, Al is chosen to be a single metal cathode.

Anode for an organic EL device can be formed by coating a conducting material on a substrate. Glass is a common and widely used substrate. In this invention, conducting material indium-tin-oxide (ITO) on glass substrate is used as the anode.

In this present invention, an organic EL device is manufactured by vacuum deposition of organic materials and cathode compressed ITO (anode)/organic layers/Al (cathode). Organic layers include hole injection layer, hole transporting layer, emitting layer and electron injection layer. The total thickness of organic layers in this present invention ranges from 5 nm to 500 nm. And the thickness of the cathode is preferably 150 nm to 250 nm. When a DC power of 5 to 25 voltage is applied to the organic EL device in this present invention, blue light emission is obtained.

The present invention will hereafter be described in detail with reference to examples, but the present invention is not limited only to the following examples.

EXAMPLE 1

Synthesis of Indole Based Compound (A) Having the Structure

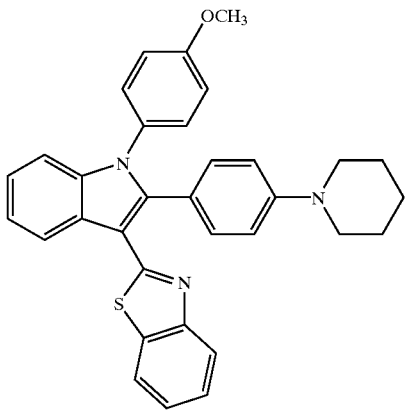

As showing in scheme (5):

Scheme (5)

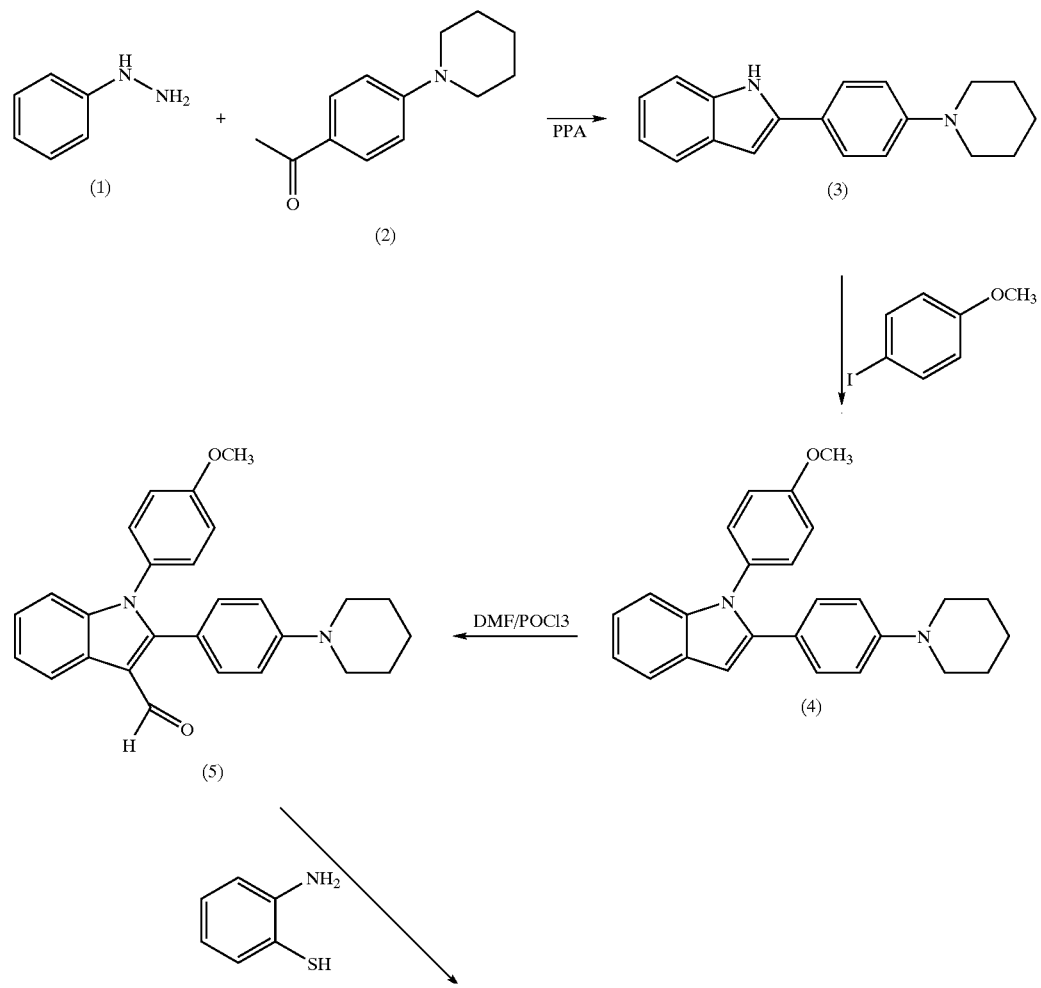

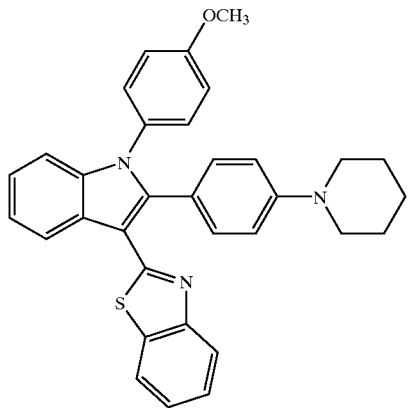

0.011 mole of phenyihydrazine and 0.01 mole of 4-piperidinoacetophenone were stirred homogenous at 120° C. A polyphosphoric acid was added into the reaction mixture at this temperature. The deep brown reaction mixture was stirred at 150° C. for another hour. After cooling, the reaction mixture was poured into stirred water slowly and the precipitated solid was collected by filtration. Washed with ethanol and ethanol:EA(5:1) to get compound (3) (45% yield). $^1$H-NMR (CDCl$_3$, TMS) δ (ppm)=1.5–1.7 (m, 6H, 4-piperidin H), 3.2 (t, 4H, 4-piperidin H), 3.8 (s, 3H, —OMe), 6.7 (s, 1H, indole H), 6.9–7.6 (m, 8H, aromatic H), 8.2 (s, 1H, NH).

An o-dichlorobenzene solution contained compound (3) (0.01 mole), copper powder (0.03 mole), and K$_2$CO$_3$ (0.03 mole) was heated to 190° C. for 30 minutes. 0.02 mole of iodoanisole was added to the reaction mixture and stirred at 190° C. for 36 hours. After cooling to 60° C., the solid mixture was dissolved in EA. K$_2$CO$_3$ and copper powder was removed by filtration. EA solution was evaporated under reduced pressure to give brown-red crude solid. Further purification by column chromatography on silica gel with hexane as an eluent gave a pale yellow solid of compound (4) (56% yield). $^1$H-NMR (CDCl$_3$, TMS) δ (ppm)=1.5–1.7 (m, 6H, 4-piperidin H), 3.1 (t, 4H, 4-piperidin H), 3.8 (s, 3H, —OMe), 6.8 (s, 1H, indole H), 6.7, 6.9 (dd, 2H,2H, aromatic H). 7.1–7.4 (m, 7H, aromatic H), 7.6 (d, 1H, aromatic H).

The solid compound (4) (0.01 mole) was dissolved in DMF (10 ml), a mixture of POCl$_3$ (0.011 mole) and DMF (0.011 mole) was added drop-wise. After stirring at 75° C. for 1 h, the reaction mixture was added into saturate NaHCO$_3$ solution. The precipitated solid was collected by filtration and washed with ethanol to give a pale gray solid of compound (5) (85% yield). $^1$H-NMR (CDCl$_3$, TMS) δ (ppm)=1.5–1.8 (m, 6H, 4-piperidin H), 3.2 (t, 4H, 4-piperidin H), 3.8 (s, 3H, —OMe), 6.8–7.4 (m, 11H, aromatic H), 8.4 (d, 1H, aromatic H), 9.9 (s, 1H, aldehyde H).

A dry DMF solution of the compound (5) (0.01 mole) was added o-aminothiophenol (0.013 mole) and Ac$_2$O (0.5 ml) at room temperature. The mixture was stirred at 60° C. for 3 h. The reaction mixture was poured into stirred benzene and the precipitated solid was collected by filtration. The crude solid was washed with MeOH and recrystallized from benzene to afford target compound (A) (32% yield). $^1$H-NMR (CDCl$_3$, TMS) δ (ppm)=1.6–1.8 (m, 6H, 4-piperidin H), 3.2 (t, 4H, 4-piperidin H), 3.8 (s, 3H, —OMe), 6.8–7.5 (m, 13H, aromatic H), 7.6, 8.0, 8.7 (d,d,d 1H,1H,1H, aromatic H).

The organic EL device in the example uses the compound (A) as the light emitting material. The example uses the glass substrates with ITO electrode having a surface resistance of 20 (Ω) as the anode.

DEVICE EXAMPLE 1-1

As shown in FIG. 1, a 60 nm organic layer 12 is formed on the ITO 11 as the hole-transporting layer by vacuum deposition of NPB having the following structure:

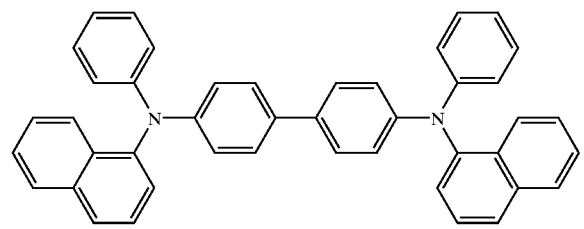

Over the hole-transporting layer 12, a 15 nm emitting layer 13 is formed by vacuum deposition of a compound (A) on the hole-transporting layer 12. Then, a 20 nm electron-transporting layer 14 is formed on the emitting layer 13 by vacuum deposition of Alq$_3$ having the following structure:

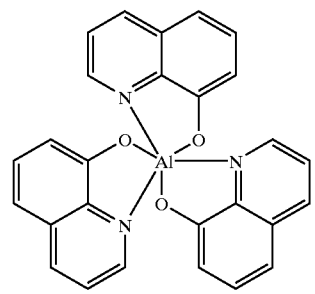

Finally, a 200 nm aluminum cathode 15 is formed by vacuum deposition on the electron-transporting layer 14. When a dc voltage of 15 V is applied to the resulting device, a 1600 cd/m$^2$ brightness blue light emission is obtained.

DEVICE EXAMPLE 1-2

Figure 2:
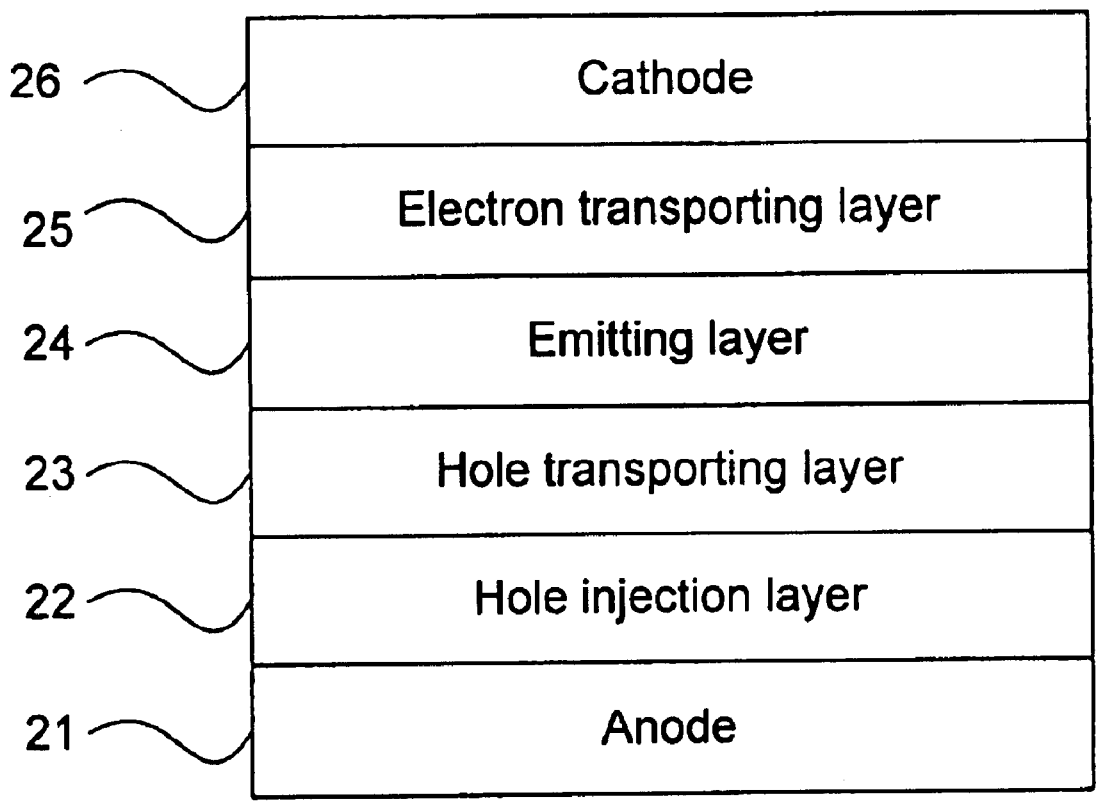
FIG. 2 illustrates another construction of the organic EL element of the present invention.

As shown in FIG. 2, a 30 nm organic layer 22 is formed on the ITO 21 as a hole injection layer by vacuum deposition of CuPC having the following structure:

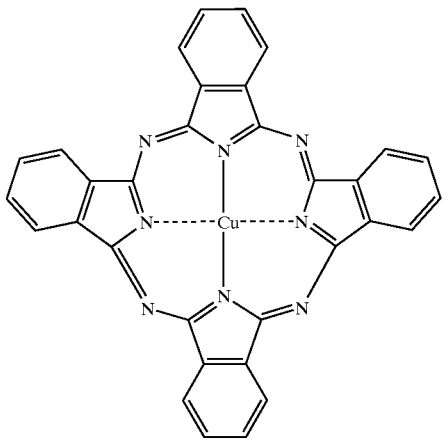

Over the hole injection layer 22, a 40 nm hole-transporting layer 23 is formed by vacuum deposition of NPB. Over the hole-transporting layer 23, a 15 nm emitting layer 24 is formed by vacuum depositions of a compound (A) on the hole-transporting layer 23. Then, a 20 nm electron-transporting layer 25 is formed by vacuum deposition of $Alq_3$ Finally, a 200 nm aluminum cathode 26 is formed by vacuum deposition on the electron-transporting layer 25. When a dc voltage of 15 V is applied to the resulting device, a 1850 $cd/m^2$ brightness blue light emission is obtained.

COMPARED DEVICE EXAMPLE 1-1

In the similar manner as applied to device example 1, a emitting layer is form by vacuum deposition of DPVBi having the structure:

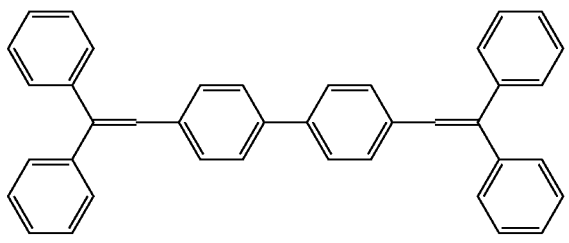

When a dc voltage of 15 V is applied to the resulting device, a 1050 $cd/m^2$ brightness blue light emission is obtained. The EL spectrum peak of examples above are shown in table (1):

TABLE 1

| Example | Wavelength (nm) |
| --- | --- |
| Device example 1-1 | 465 |
| Device example 1-2 | 465 |
| Compared device example 1-1 | 490 |

In comparison with DPVBi as light emitting material, an organic EL device using compound (A) as light emitting material has higher brightness and color purity.

EXAMPLE 2

Synthesis of Indole Based Compound (B) Having the Structure

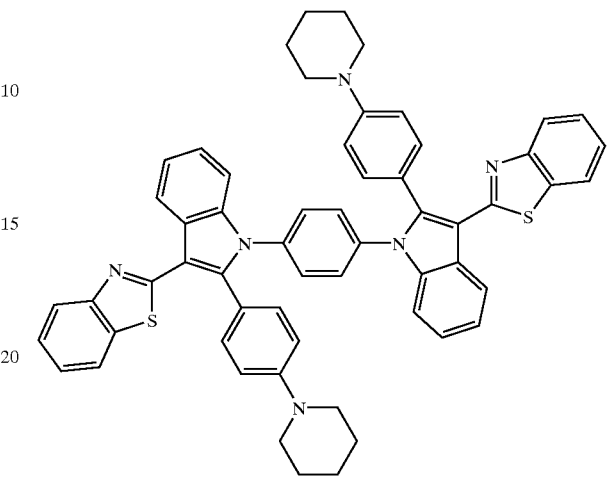

As showing in scheme (6):

Scheme (6)

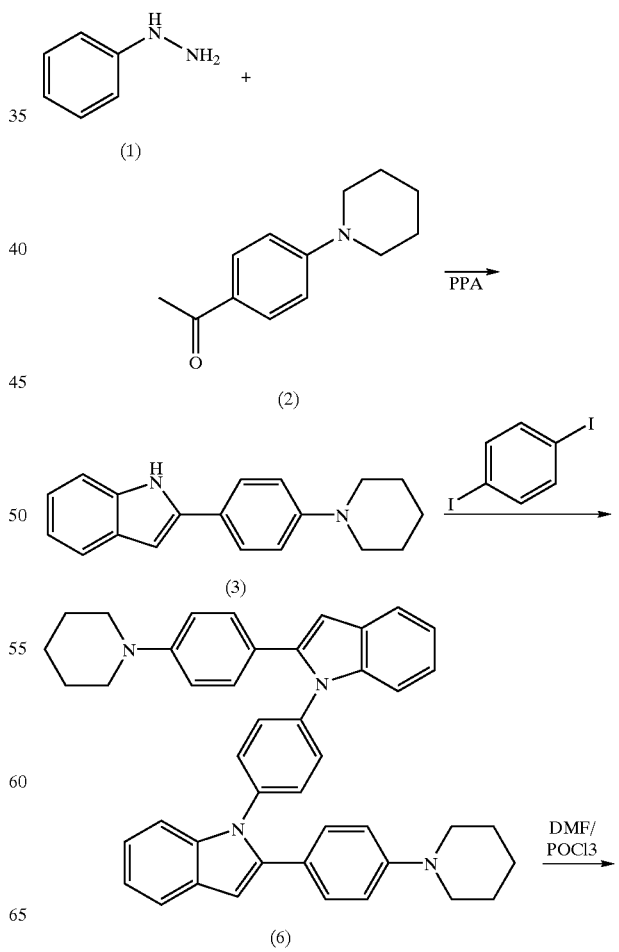

-continued

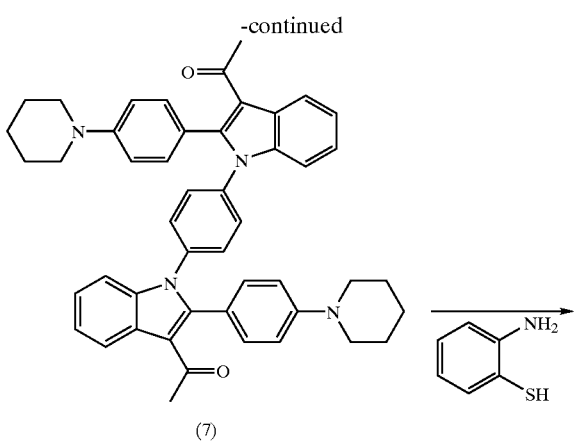

(7)

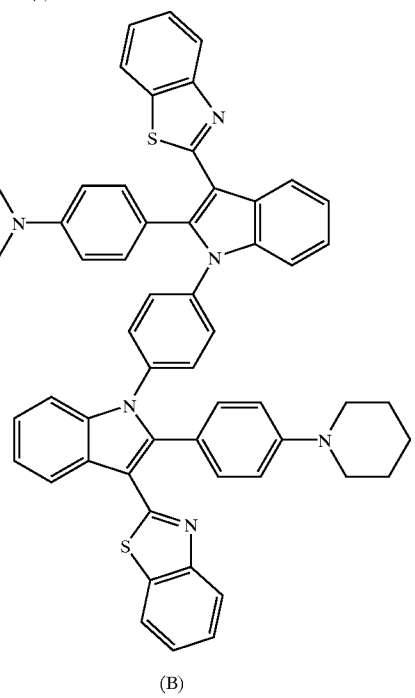

(B)

The 0.011 mole of phenylhydrazine and 0.01 mole of 4-piperidinoacetophenone were stirred homogenous at 120° C. A polyphosphoric acid was added into the reaction mixture at this temperature. The deep brown reaction mixture was stirred at 150° C. for another hour. After cooling, the reaction mixture was poured into stirred water slowly and the precipitated solid was collected by filtration. Washed with ethanol and ethanol:EA(5:1) to get compound (3) (45% yield). $^1$H-NMR (CDCl$_3$, TMS) δ (ppm)=1.5–1.7 (m, 6H, 4-piperidin H), 3.2 (t, 4H, 4-piperidin H), 3.8 (s, 3H, —OMe), 6.7 (s, 1H, indole H), 6.9–7.6 (m, 8H, aromatic H), 8.2 (s, 1H, NH).

An o-dichlorobenzene solution contained compound (3) (0.02 mole), copper powder (0.05 mole), and K$_2$CO$_3$ (0.05 mole) was heated to 190° C. for 30 minutes. 0.03 mole of 1,4-diiodobenzene was added to the reaction mixture and stirred at 190° C. for 36 hours. After cooling to 60° C., the solid mixture was dissolved in EA. K$_2$CO$_3$ and copper powder was removed by filtration. EA solution was evaporated under reduced pressure to give brown-red crude solid. Further purification by column chromatography on silica gel with hexane as an eluent gave a pale yellow solid of compound (6) (41% yield). $^1$H-NMR (CDCl$_3$, TMS) δ (ppm)=1.5–1.7 (m, 12H, 4-piperidin H), 3.1 (t, 8H, 4-piperidin H), 6.8 (s, 2H, indole H), 6.7–7.3 (m, 18H, aromatic H), 7.6 (m, 2H, aromatic H).

The solid compound (6) (0.01 mole) was dissolved in DMF (10 ml), a mixture of POCl$_3$ (0.023 mole) and DMF (0.023 mole) was added drop-wise. After stirring at 75° C. for 1 h, the reaction mixture was added into saturate NaHCO$_3$ solution. The precipitated solid was collected by filtration and washed with ethanol to give a pale gray solid of compound (7) (76% yield). $^1$H-NMR (CDCl$_3$, TMS) δ (ppm)=1.5–1.8 (m, 12H, 4-piperidin H), 3.2 (t, 8H, 4-piperidin H), 6.8–7.4 (m, 18H, aromatic H), 8.4 (m, 2H, aromatic H), 9.9 (s, 2H, aldehyde H).

A dry DMF solution of the compound (7) (0.01 mole) was added o-aminothiophenol (0.03 mole) and Ac$_2$O (0.7 ml) at room temperature. The mixture was stirred at 80° C. for 6 h. The reaction mixture was poured into stirred benzene and the precipitated solid was collected by filtration. The crude solid was washed with MeOH and recrystallized from benzene to afford target compound (B) (27% yield). $^1$H-NMR (CDCl$_3$, TMS) δ (ppm)=1.6–1.8 (m, 12H, 4-piperidin H), 3.2 (t, 8H, 4-piperidin H), 6.8–7.9 (m, 26H, aromatic H), 8.8 (d, 2H, aromatic H).

Organic EL device example using compound (B) as light emitting material.

DEVICE EXAMPLE 2-1

In the similar manner as applied to device example 1-1, an emitting layer is formed by a vacuum deposition of compound (B).

DEVICE EXAMPLE 2-2

In the similar manner as applied to device example 1-2, an emitting layer is formed by vacuum deposition of compound (B).

The EL spectrum peak and brightness of examples above are shown in table (2):

TABLE 2

| example | Brightness (cd/m$^2$) | Wavelength (nm) |
|---|---|---|
| Device example 2-1 | 2800 | 470 |
| Device example 2-2 | 3000 | 470 |
| Compared device example 1-1 | 1050 | 490 |

In comparison with DPVBi as light emitting material, an organic EL device uses the compound (B) as light emitting material has higher brightness and color purity.

EXAMPLE 3
Synthesis of Indole Based Compound (C) Having the Structure
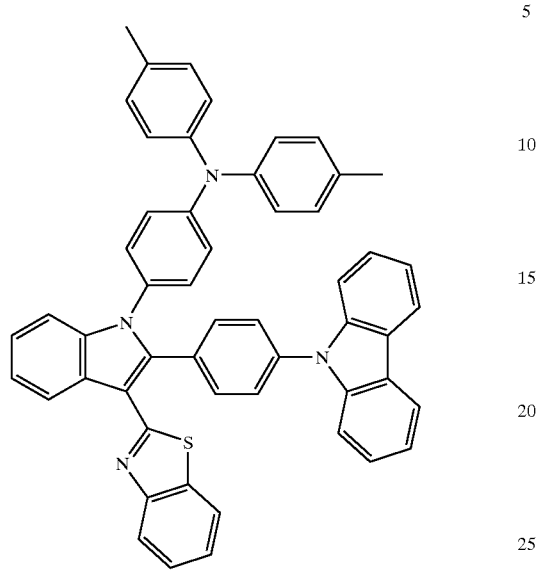
As showing in scheme (7):
Scheme (7)
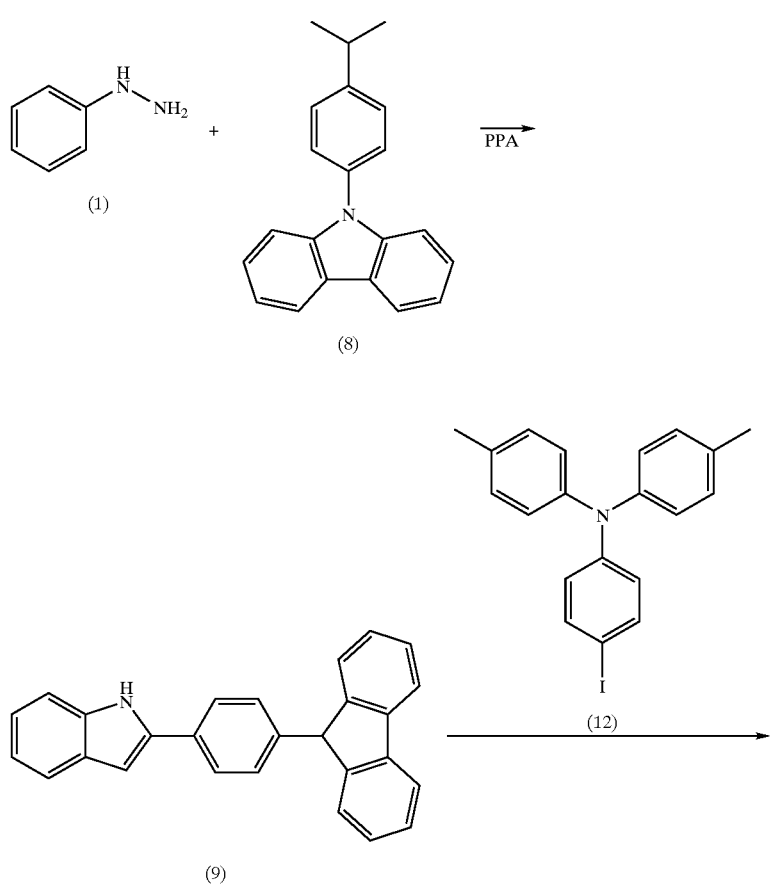

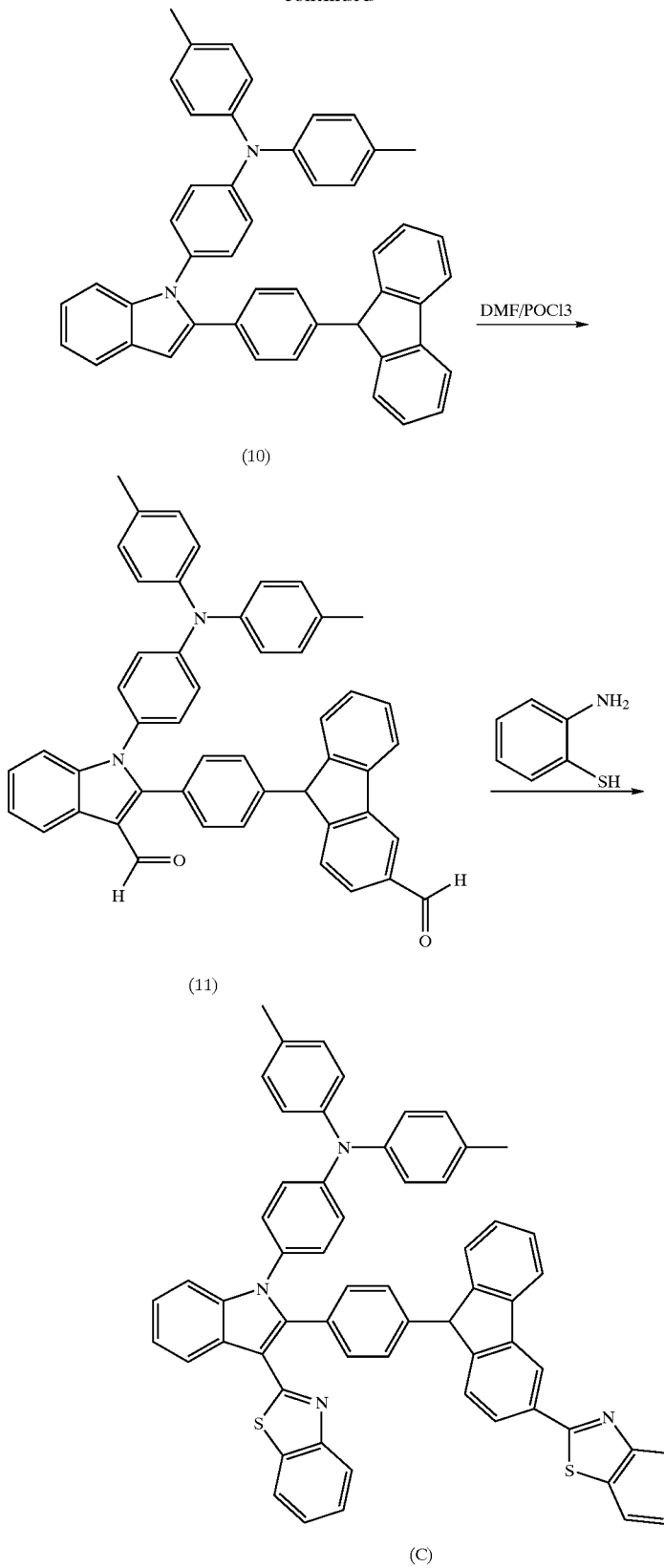
0.011 mole of phenylhydrazine and 0.01 mole of compound (8) were stirred homogenous at 120° C. A polyphosphoric acid was added into the reaction mixture at this temperature. The deep brown reaction mixture was stirred at 160° C. for another hour. After cooling, the reaction mixture was poured into stirred water slowly and the precipitated solid was collected by filtration. Washed with ethanol and ethanol:EA(5:1) to get compound (9) (52% yield). $^1$H-NMR (CDCl$_3$, TMS) δ (ppm)=6.6 (s, 1H, indole H), 6.9–7.6 (m, 14H, aromatic H), 8.0 (s, 1H, NH), 8.2 (d, 2H, carbazole H).

An o-dichlorobenzene solution contained compound (9) (0.01 mole), copper powder (0.03 mole), and K$_2$CO$_3$ (0.03 mole) was heated to 190° C. for 60 minutes. 0.015 mole of compound (12) was added to the reaction mixture and stirred at 190° C. for 36 hours. After cooling to 60° C., the solid mixture was dissolved in EA. K$_2$CO$_3$ and copper powder was removed by filtration. EA solution was evaporated under reduced pressure to give brown-red crude solid. Further purification by column chromatography on silica gel with toluene as an eluent gave a pale yellow solid of compound (10) (35% yiled). $^1$H-NMR (CDCl$_3$, TMS) δ (ppm)=2.3 (s, 6H, Ar—CH$_3$), 6.7 (s, 1H, indole H), 6.9–7.3 (m, 24H, aromatic H), 7.6 (m, 2H, aromatic H), 8.1 (d, 2H, carbazole H).

The solid compound (10) (0.01 mole) was dissolved in DMF (15 ml), a mixture of POCl$_3$ (0.021 mole) and DMF (0.022 mole) was added drop-wise. After stirring at 75° C. for 2 h, the reaction mixture was added into saturate NaHCO$_3$ solution. The precipitated solid was collected by filtration and washed with ethanol to give a pale gray solid of compound (11) (62% yield). $^1$H-NMR (CDCl$_3$, TMS) δ (ppm)=2.3 (s, 6H, Ar—CH$_3$), 6.8–7.5 (m, 21H, aromatic H), 7.9 (d, 1H, carbazole H), 8.4 (d, 1H, aromatic H), 8.6 (d, 1H, carbazole H), 9.8, 10.0 (s, s, 1H, 1H, aldehyde H).

A dry DMF solution of the compound (11) (0.01 mole) was added o-aminothiophenol (0.03 mole) and Ac$_2$O (0.7 ml) at room temperature. The mixture was stirred at 80° C. for 6 h. The reaction mixture was poured into stirred benzene and the precipitated solid was collected by filtration. The crude solid was washed with MeOH and recrystallized from benzene to afford target compound (C) (22% yield). $^1$H-NMR (CDCl$_3$, TMS) δ (ppm)=2.3 (s, 6H, Ar—CH$_3$), 6.8–7.5 (m, 27H, aromatic H), 7.7–8.2 (m, 6H, aromatic H), 8.7 (d, 1H, aromatic H), 8.9 (s, 1H, aromatic H).

The Organic EL device in the example uses the compound (C) as light emitting material.

DEVICE EXAMPLE 3-1

In the similar manner as applied to device example 1-1, a emitting layer is formed by vacuum deposition of compound (C).

DEVICE EXAMPLE 3-2

In the similar manner as applied to device example 1-2, an emitting layer is formed by vacuum deposition of compound (C). The EL spectrum peak and brightness of examples above are shown in table (3):

TABLE 3

| Example | Brightness (cd/m$^2$) | Wavelength (nm) |
| --- | --- | --- |
| Device example 3-1 | 1570 | 455 |
| Device example 3-2 | 1620 | 455 |
| Compared device example 1-1 | 1050 | 490 |

In comparison with DPVBi as the light emitting material, an organic EL device using compound (C) as the light emitting material has higher brightness and color purity.

Reviewing the above organic EL device examples of this present invention, it is pointed out that in comparison with the DPVBi, a common blue light emitting material, the organic EL device can obtain higher brightness and color purity when containing a light emitting material having the general formula (1):

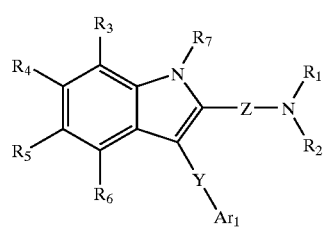

(1)

Particularly, Ar$_1$ represents a substituted or unsubstituted aromatic hydrocarbon group, or a substituted or unsubstituted aromatic heterocyclic group; Y represents a single bond or methylone —CH=CH— group; Z represents a substituted or unsubstituted aromatic hydrocarbon group, or a substituted or unsubstituted aromatic heterocyclic group; R1 and R2 represent a substituted or unsubstituted alkyl group, a substituted or unsubstituted aromatic hydrocarbon group, or a substituted or unsubstituted aromatic heterocyclic group; any two of Z, R1 and R2 may form an aromatic heterocyclic or hydrocarbon ring; R3 to R6 each independently represent a hydrogen atom, a halogen, a cyano group, a substituted or unsubstituted alkyl group, a substituted or unsubstituted amino group, a substituted or unsubstituted alkoxy group, a substituted or unsubstituted aromatic hydrocarbon group, or a substituted or unsubstituted aromatic heterocyclic group; and R7 represents a substituted or unsubstituted alkyl group, a substituted or unsubstituted aromatic hydrocarbon-group, or a substituted or unsubstituted aromatic heterocyclic group.

What is claimed is:

1. An organic EL device comprising:

an anode;

a cathode; and one or more organic thin film layers including a light emitting layer adjacent to said anode and said cathode, wherein at least one of the said organic thin film layers contains a compound represented by the following formula (1A):

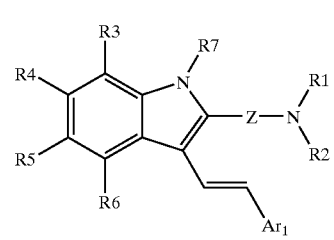

(1A)

and wherein Ar$_1$ represents a substituted or unsubstituted aromatic hydrocarbon group, or a substituted or unsubstituted aromatic heterocyclic group; Z represents a substituted or unsubstituted aromatic hydrocarbon group, or a substituted or unsubstituted aromatic heterocyclic group; R1 and R2 represent a substituted or unsubstituted alkyl group, a substituted or unsubstituted aromatic hydrocarbon group, or a substituted or unsubstituted aromatic heterocyclic group; R3 to R6 each independently represents a hydrogen atom, a halogen atom, a cyano group, a substituted or unsubstituted alkyl group, a substituted or unsubstituted amino group, a substituted or unsubstituted alkoxy group, a substituted or unsubstituted aromatic hydrocarbon group, or a substituted or unsubstituted aromatic heterocyclic group, and R7 represents a substituted or unsubstituted alkyl group, a substituted or unsubstituted aromatic hydrocarbon group, or a substituted or unsubstituted aromatic heterocyclic group.

2. An organic EL device comprising:

an anode;

a cathode; and one or more organic thin film layers including a light emitting layer adjacent to said anode and said cathode, wherein at least one of the said organic thin film layers contains a compound represented by the following formula (1B):

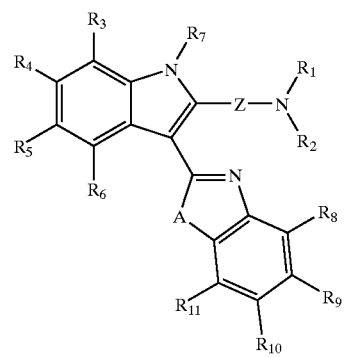

(1B)

and wherein A represents an oxygen atom, a nitrogen atom bonded to hydrogen or a substituent, or a sulfur atom; Z represents a substituted or unsubstituted aromatic hydrocarbon group, or a substituted or unsubstituted aromatic heterocyclic group; R1 and R2 represent a substituted or unsubstituted alkyl group, a substituted or unsubstituted aromatic hydrocarbon group, or a substituted or unsubstituted aromatic heterocyclic group; R3 to R6 and R8 to R11 each independently represents a hydrogen atom, a halogen atom, a cyano group, a substituted or unsubstituted alkyl group, a substituted or unsubstituted amino group, a substituted or unsubstituted alkoxy group, a substituted or unsubstituted aromatic hydrocarbon group, or a substituted or unsubstituted aromatic heterocyclic group; and R7 represents a substituted or unsubstituted alkyl group, a substituted or unsubstituted aromatic hydrocarbon group, or a substituted or unsubstituted aromatic heterocyclic group.

3. An organic EL device comprising:

an anode;

a cathode; and one or more organic thin film layers including a light emitting layer adjacent to said anode and said cathode, wherein at least one of the said organic thin film layers contains a compound represented by the following formula (1C):

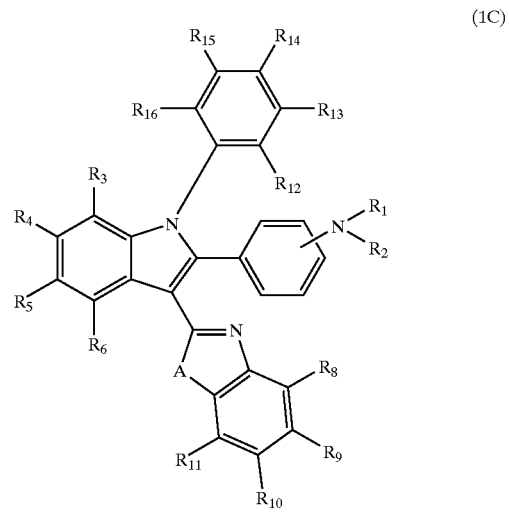

(1C)

and wherein A represents an oxygen atom, a nitrogen atom bonded to hydrogen or a substituent, or a sulfur atom; R1 and R2 represent a substituted or unsubstituted alkyl group, a substituted or unsubstituted aromatic hydrocarbon group, or a substituted or unsubstituted aromatic heterocyclic group; R3 to R6, R8 to R11 and R12 to R16 each independently represents a hydrogen atom, a halogen atom, a cyano group, a substituted or unsubstituted alkyl group, a substituted or unsubstituted amino group, a substituted or unsubstituted alkoxy group, a substituted or unsubstituted aromatic hydrocarbon group, or a substituted or unsubstituted aromatic heterocyclic group.

* * * * *